United States Patent [19]
Iwasaki

[11] Patent Number: 5,612,532
[45] Date of Patent: Mar. 18, 1997

[54] THIN IC CARD AND METHOD FOR PRODUCING THE SAME

[75] Inventor: Hiroshi Iwasaki, Kanagawa, Japan

[73] Assignee: Kabushiki Kaisha Toshiba, Kanagawa-ken, Japan

[21] Appl. No.: 554,927

[22] Filed: Nov. 9, 1995

Related U.S. Application Data

[63] Continuation of Ser. No. 272,549, Jul. 11, 1994, abandoned.

[30] Foreign Application Priority Data

Sep. 1, 1993 [JP] Japan ................................ 5-217504
Dec. 17, 1993 [JP] Japan ................................ 5-318632

[51] Int. Cl.$^6$ .................................................. G06K 19/06
[52] U.S. Cl. ........................ 235/492; 235/486; 235/487; 235/491; 343/741
[58] Field of Search ................................ 235/492, 486, 235/487, 491; 343/741; 257/679

[56] References Cited

U.S. PATENT DOCUMENTS

| | | | |
|---|---|---|---|
| 5,049,728 | 9/1991 | Rovin | 235/492 |
| 5,151,774 | 9/1992 | Mori et al. | 235/492 X |
| 5,206,495 | 4/1993 | Kreft | 235/492 |
| 5,225,667 | 7/1993 | Furuta et al. | 235/492 |
| 5,362,955 | 11/1994 | Hagihiri-Tehrani | 235/492 |
| 5,444,222 | 8/1995 | Inoue | 235/492 X |

FOREIGN PATENT DOCUMENTS

| | | |
|---|---|---|
| 0231384A1 | 8/1987 | European Pat. Off. . |
| 2647572A1 | 11/1990 | France . |
| 4105869A1 | 8/1992 | Germany . |
| 4218923A1 | 10/1992 | Germany . |
| 4243654A1 | 7/1993 | Germany . |
| 1185783 | 7/1989 | Japan . |
| 4-16831 | 3/1992 | Japan . |

*Primary Examiner*—Donald T. Hajec
*Assistant Examiner*—Michael G. Lee
*Attorney, Agent, or Firm*—Finnegan, Henderson, Farabow, Garrett & Dunner, L.L.P.

[57] ABSTRACT

A thin IC card which is highly reliable, simple in construction and structure, to which a function section relating to main information processing can be easily attached, and which has improved portability, and a method for producing it are disclosed. This thin IC card is characterized by including a plate type IC module in which a semiconductor device having at least memory function and CPU function has its one side sealed or molded with a resin, and flat type externally connecting terminals have their one end connected to the input/output terminals of the semiconductor device and the other end led and exposed to a non-resin sealed or molded side, and a card-like support which has a fitting section for fitting the plate type IC module with the surface of the externally connecting terminals of the plate type IC module exposed to be substantially flush with the surface of the card, a required circuit wiring, an antenna for sending and receiving a signal without contacting, and if necessary an oscillator for specifying a frequency and a power supply battery.

53 Claims, 4 Drawing Sheets

THIN IC CARD AND METHOD FOR PRODUCING THE SAME

This application is a continuation, of application Ser. No. 08/272,549 filed Jul. 11, 1994 now abandoned.

BACKGROUND OF THE INVENTION

1. Field of the Invention

This invention relates to a thin IC card and a method for producing a thin IC card.

2. Description of the Related Art

Conventionally known storage means for recording or storing various data include, for example, contact type microcomputer cards having a built-in CPU and non-contact type wireless cards which use an electric wave to send and receive information. These cards are generally called the IC card, have advantages and superiority in practical uses, and are practically used broadly in the form utilizing their advantages and superiority. In view of the inconvenience in using these cards properly depending on where they are used, composite IC cards which have the advantages and superiority of the contact type and non-contact type IC cards have been developed (e.g. Japanese Patent Publication No. 4-16831). Specifically, such IC cards have (a) the advantages of the contact type IC card which processes inputs from an external device connected via electrical contacts by a semiconductor chip (IC chip) having the functions of a memory or CPU built in the IC card, takes out the processed inputs as a new signal, and automatically checks the signal, and (b) the advantages of the non-contact type IC card in which an electromagnetic field formed by an external device is received by an antenna and rectified or detected to obtain a signal, information previously stored is called by this signal, and the required processing of information is conducted without complexity and contacting.

In the above composite IC cards, the CPU having the memory function relating to main information processing is fixed, so that the capacity and functions of the composite IC cards are limited. Therefore, it is necessary to always maintain or have a plurality of composite IC cards having a built-in semiconductor chip as the function element for each use. In other words, it is always necessary to keep or carry a plurality of composite IC cards having dimensions (85.6 mm long, 54.0 mm wide, 0.76 mm thick) according to the standard of JEIDA, and practicality is limited in view of carrying and space because plural composite IC cards have to be always kept or carried.

Accordingly, an object of this invention is to provide a highly reliable thin IC card and a method for producing it.

And, another object of this invention is to provide a thin IC card having a simple structure and construction and a method for producing it.

Further, another object of this invention is to provide a thin IC card having remarkably improved portability and a method for producing it.

SUMMARY OF THE INVENTION

A thin IC card according to this invention includes:

a plate type IC module which has on its one side a semiconductor chip having at least memory function and CPU function sealed or molded with a resin, and has flat type externally connecting terminals whose one end connected to the input/output terminals of the semiconductor chip and other end led and exposed to a non-resin sealed or molded side, and a card-like support which has a fitting section for fitting therein the plate type IC module with the side of externally connecting terminals of the plate type IC module exposed to be substantially flush with the surface of the card-like support, a required circuit wiring, an antenna for sending and receiving a signal without contacting, and if necessary an oscillator for specifying a frequency and a power supply battery.

A method for producing the thin IC card according to this invention includes:

a step of forming a card-like wiring board having a required circuit wiring and an antenna for sending and receiving a signal without contacting therein, a step of forming a card-like support by providing a structure to fit or include a plate type IC module which has on its one side a semiconductor chip having at least memory function and CPU function sealed or molded with a resin, and has flat type externally connecting terminals electrically connected to the input/output terminals of the semiconductor chip and led and exposed to a non-resin sealed or molded side, and, if necessary, an oscillator for specifying a frequency and a power supply battery into predetermined areas of the card-like wiring board, a step of fitting, including or arranging the plate type IC module in a predetermined area of the card-like support with the side of the externally connecting terminals of the plate type IC module exposed to be substantially flush with the surface of the card-like support, and a step of electrically connecting the plate type IC module and, if necessary, the oscillator and the power supply battery, which are fitted, included or arranged in the predetermined areas of the card-like support by the predetermined circuit wiring within the card-like support.

This invention may omit the power supply battery when electric power is generated by providing an IC chip with a function for oscillating a frequency, or by an electromagnetic induction method which uses the antenna provided in the card-like support and appropriately applies a high frequency having a changed wavelength to the antenna. And, if it is necessary in view of the function, an oscillator for specifying a frequency and a power supply battery may be separately fitted or provided.

DESCRIPTION OF THE PREFERRED EMBODIMENTS

The thin IC card according to this invention is a so-called composite IC card. Specifically, this thin IC card has both advantages and superiority of contact and non-contact type IC cards, and adopts a structure capable of easily fitting an only function section which relates to main information processing. More specifically, this IC card has one element which is a plate type IC module in which a semiconductor chip having at least memory function and CPU function is sealed on its one side with a resin, and externally connecting terminals to be connected to the input/output terminals of the semiconductor chip are flatly led and exposed to a non-resin sealed or molded side. And, the plate type IC module is structured to be able to be optionally attached to or removed from a card-like support which includes therein a required circuit wiring, an antenna for sending and receiving a signal without contacting, and if necessary an oscillator for specifying a frequency and a power supply battery. In other words, the card-like support is provided with versatility, so that the plate type IC module can be removed and changed to easily meet various applications.

Embodiments of this invention will be described with reference to FIG. 1 through FIG. 8.

Embodiment 1

Figure 1:
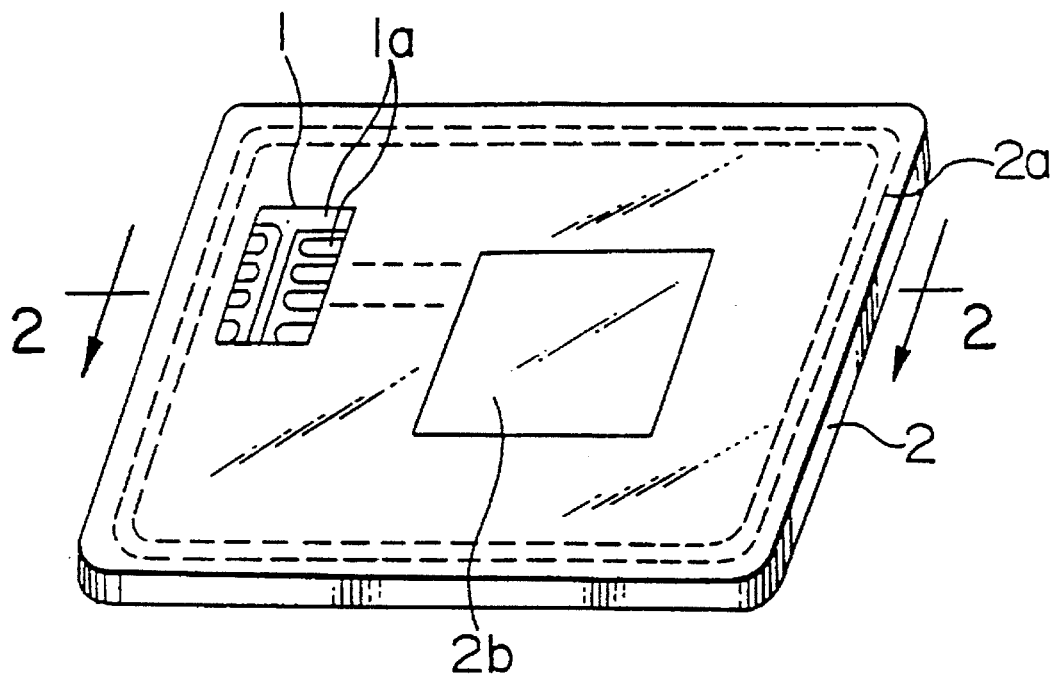
FIG. 1 is a perspective view sing through a structural example of the essential part of the thin IC card according to this invention.
Figure 2:
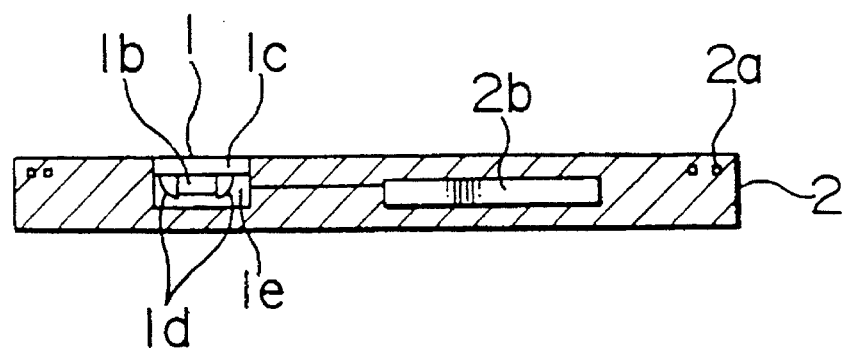
FIG. 2 is a sectional view taken along line 2—2 of FIG. 1.

FIG. 1 is a perspective view seeing through a rough structural embodiment of the thin IC card according to this invention. And FIG. 2 is a sectional view taken along line 2—2 of FIG. 1. In FIG. 1 and FIG. 2, reference numeral 1 is a plate type IC module. The plate type IC module 1 includes a semiconductor chip (IC chip) having at least memory and CPU functions and having its one side sealed or molded with a resin, and flat type externally connecting terminals 1a which have their one end connected to the input/output terminals of the semiconductor chip and the other end led and exposed to a non-resin sealed or molded side. Reference numeral 2 is a card-like support which is configured such that the plate type IC module 1 can be fitted easily. The card-like support having a first area and a second area formed outside of the first area. More specifically, the card-like support 2 includes therein a required circuit wiring, an antenna 2a formed inside the second area of the card-like support for sending and receiving a signal without contacting and a power supply battery 2b, and has a fitting section formed in the first area of the card-like support for fitting the plate type IC module 1 with the side of its externally connecting terminals 1a exposed to be substantially flush with the surface of the card.

Figure 3:
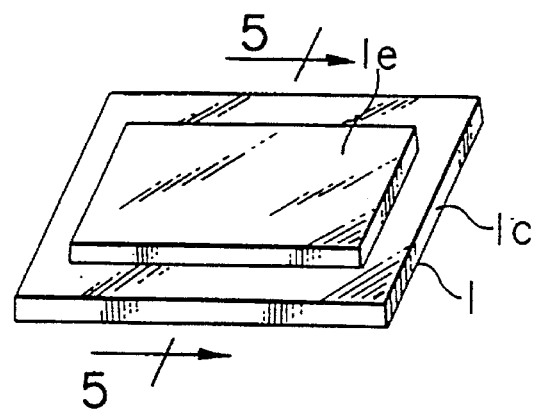
FIG. 3 is a front perspective view showing a structural example of the essential part of a plate type IC module provided in the thin IC card according to this invention.
Figure 4:
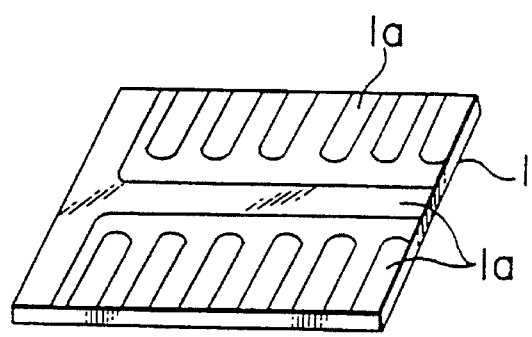
FIG. 4 is a back perspective view showing a structural example of the essential part of the plate type IC module of FIG. 3.
Figure 5:
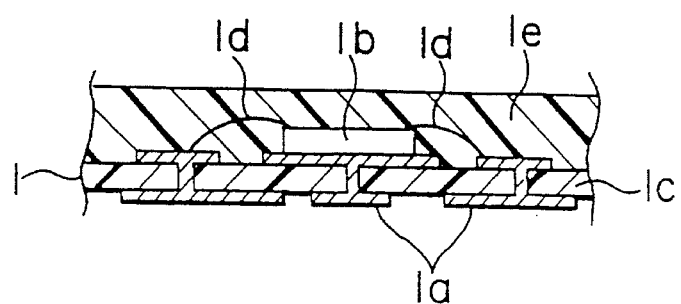
FIG. 5 is a sectional view of the essential part taken along line 5—5 of FIG. 3.

In further detail, the plate type IC module 1 is structured as shown in FIG. 3 which perspectively shows one side sealed or molded with a resin, FIG. 4 which perspectively shows the other side (reverse side) not sealed or molded with a resin, and FIG. 5 which shows a cross section taken along line 5—5 of FIG. 3. For example, a CPU 1b including a nonvolatile semiconductor memory is placed on the surface of a so-called through-hole resin type wiring board 1c by a wire bonding 1d. The through-hole wiring board 1c has dimensions of, for example, approximately 14.0 mm long, 13.0 mm wide, and 0.3 mm thick. The CPU 1b may include a static electricity resistant element for input/output and for preventing electrostatic breakdown, if necessary.

The wiring board 1c having on its one side the CPU 1b including a nonvolatile semiconductor memory mounted, is sealed or molded with, for example, a transfer mold layer 1e to form the thin plate type IC module 1 which is packaged to have a total thickness of about 0.6 mm (formed into a package). For making this structure, flip chip bonding, which directly applies the reverse side of the CPU 1b to the surface of the wiring board 1c, may be used instead of the wire bonding 1d. In this case, the packaged thin plate type IC module 1 may have a structure in that its one side having the CPU 1b is not entirely sealed or molded with the resin layer 1e but partly coated or sealed to fill a space between the IC chip 1b and the wiring board 1c as shown in the sectional view of FIG. 6. The through-hole wiring board 1c whose one side is sealed, or the back side (non-resin sealed or molded side) of the plate type IC module 1 has the flat (flat type) terminals 1a which are led through the through holes. And, the flat terminals 1a have their surface plated with gold (Au) and, when they are used in a contact type, they functions as externally connecting terminals to electrically connect with the contacts of external equipment (read/writer).

On the other hand, the card-like support 2 has dimensions (85.6 mm long, 54.0 mm wide, and 0.76 mm thick) according to the standard of, for example, JEIDA, and is provided with a fitting section for fitting or mounting at least the plate type IC module 1 with the surface of the externally connecting terminals 1a of the plate type IC module 1 exposed to be flush with the surface of the card-like support 2. Further, the card-like support 2 has the antenna 2a for sending and receiving a signal without contacting and the power supply battery 2b built in (internally disposed), embedded, fitted or mounted, and also has a wiring circuit, which electrically connects the aforementioned fitted or mounted respective parts to cause the required functions of the card to operate, built in or embedded. And, the wiring circuit is internally arranged in the card-like support 2 in the form of a single layer or multiple layers, and the antenna 2a for sending and receiving a signal without contacting is generally arranged internally in the circumferential area within the card-like support 2. In the structure of the card-like support 2, when the plate type IC module 1 is fitted or mounted in the fitting section of the card-like support 2, the plate type IC module 1 can be electrically connected to the connection terminals of the internally arranged wiring circuit.

In this embodiment, the power supply battery 2b which is built in, embedded, fitted or mounted to the card-like support 2 may be a secondary battery, which can be externally charged through the externally connecting terminals 1a of the plate type IC module 1.

Examples of producing or fabricating the above thin film IC card will be described.

First, the card-like wiring board, which has the required circuit wiring and the antenna 2a for sending and receiving a signal without contacting therein, is formed. This card-like wiring board is produced by a conventional technology for producing printed wiring boards, such as photo-etching, lithography, and laminating technologies. Then, the card-like support 2 is produced by disposing a structure to fit or build-in the plate type IC module 1 and the power supply battery 2b in prescribed areas of the formed card-like wiring board. In this case, the power supply battery 2b may be previously embedded in the previous process of forming the card-like wiring board.

Then, the plate type IC module 1 is fitted and arranged in the fitting section for the plate type IC module, which is formed in a prescribed area of the card-like support 2, with the surface of the externally connecting terminals 1a of the plate type IC module 1 exposed to be substantially flush with the surface of the card. When the plate type IC module 1 is fitted to the card-like support 2, it is electrically connected to the connecting terminals which are previously arranged in the fitting section for the plate type IC module. Then, the power supply battery 2b and the like are built in or arranged in prescribed areas in the card-like support 2 and electrically connected to the prescribed circuit wiring, thereby completing the assembling and the production of a desired thin film IC card. In the production of the card-like wiring board (or the card-like support 2), the wiring board body having the required circuit wiring may be formed previously, and several resin film layers may be applied to either side of the wiring board body. For example, as shown in the perspective view of FIG. 7, there may be employed a structure to position and apply an insulating thin plate 3 having a thickness of about 0.3 mm which has a window 3a to expose and fit the flat type externally connecting terminals 1a of the plate type IC module 1 and a recessed fitting section for the power supply battery 2b, a card-like circuit board body 3' having a thickness of about 0.3 mm which has open fitting sections for the IC module 1 and the power supply battery 2b and the built-in antenna 2a electrically connected to the circuit wiring, and an insulating thin plate 3" having a thickness of about 0.16 mm to one another into three layers.

And, although the above structure includes the power supply battery 2b, the provision or attachment of the power supply battery 2b may be omitted. Specifically, to the antenna 2a for sending and receiving a signal without contacting, which is provided or built in the card-like support 2, an electric wave whose wavelength is changed is applied at timing different from the signal to generate electric power by electromagnetic induction. Thus, the required functions can be given to the non-contact type IC card even when the power supply battery 2b is omitted.

Embodiment 2

Figure 8:
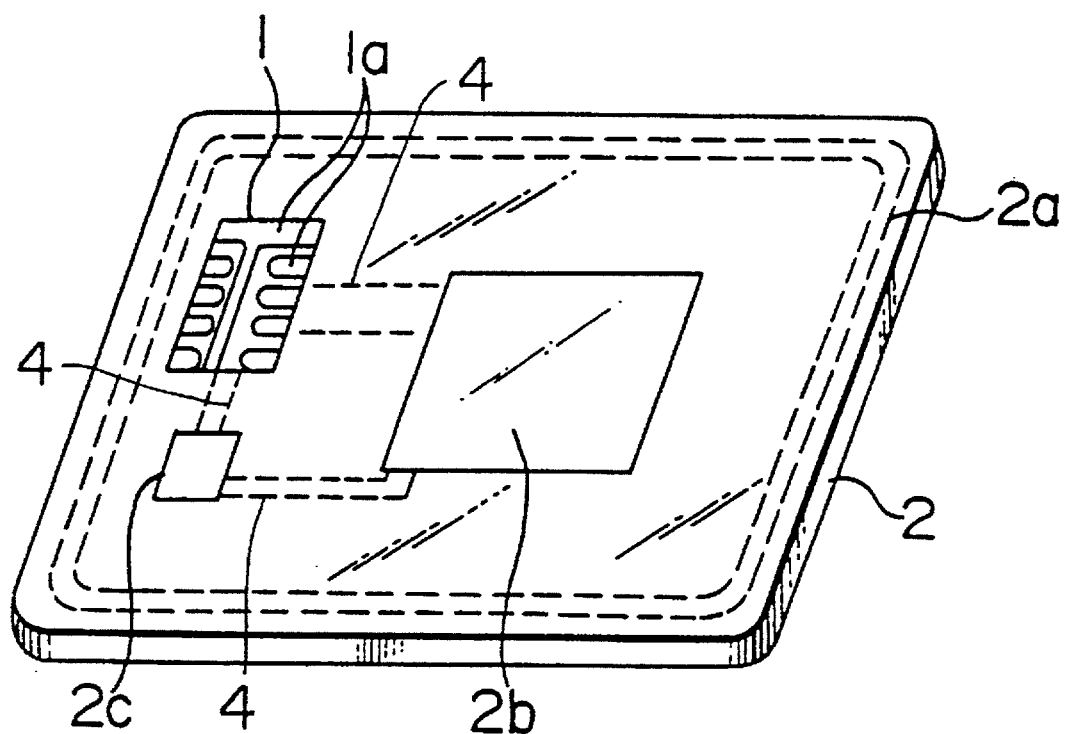
FIG. 8 is a perspective view seeing through another structural example of the essential part of the thin IC card according to this invention.

FIG. 8 is a perspective view seeing through another rough structural embodiment of the thin IC card according to this invention, in which reference numeral 1 is a plate type IC module. This plate type IC module 1 includes a semiconductor chip (IC chip) having at least memory and CPU functions and having its one side sealed or molded with a resin, and flat type externally connecting terminals 1a which have their one end connected to the input/output terminals of the semiconductor chip and the other end led and exposed to a non-resin sealed or molded side. Reference numeral 2 is a card-like support which is configured such that the plate type IC module 1 can be attached or removed freely. More specifically, the card-like support 2 includes therein a required circuit wiring (not shown), an antenna 2a for sending and receiving a signal without contacting, an oscillator 2c for specifying a frequency and a power supply battery 2b, and has a fitting section for fitting the plate type IC module 1 therein with the surface of the externally connecting terminals 1a exposed to be substantially flush with the surface of the card.

Figure 6:
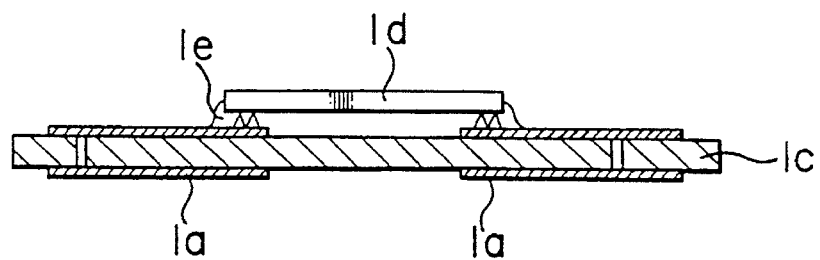
FIG. 6 is a sectional view showing another structural example of the essential part of the thin IC card according to this invention.
Figure 7:
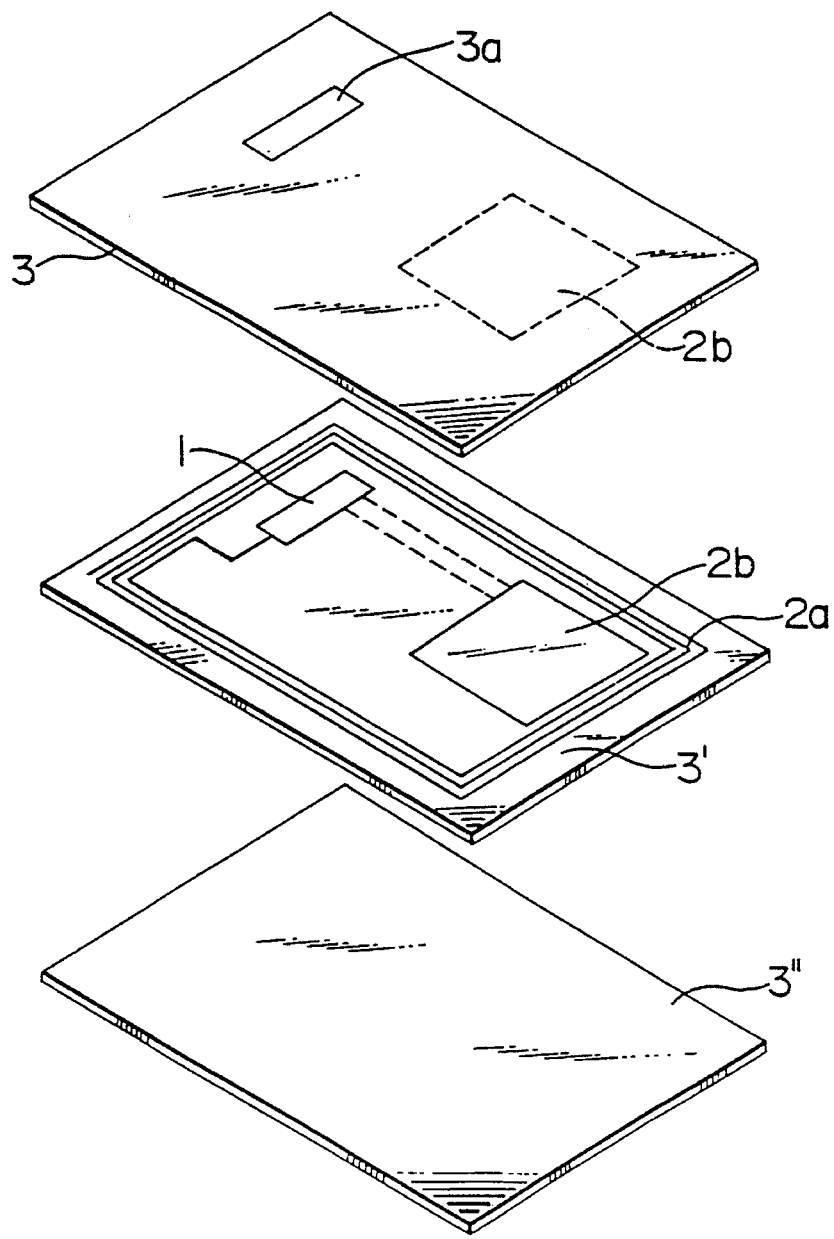
FIG. 7 is a perspective view exploded showing still another structural example of the essential part of the thin IC card according to this invention.

In further detail, the plate type IC module 1 has the same structure as in Embodiment 1. That is, it is structured as shown in FIG. 3 which perspectively shows one side sealed or molded with a resin, FIG. 4 which perspectively shows the other side (reverse side) not sealed or molded with a resin, and FIG. 5 which shows a cross section. For example, a CPU 1b including a nonvolatile semiconductor memory is placed on the surface of so-called through-hole resin type wiring board 1c by a wire bonding 1d. The through-hole wiring board 1c has dimensions of, for example, approximately 14.0 mm long, 13.0 mm wide, and 0.30 mm thick. The CPU 1b may include a static electricity resistant element for input/output and for preventing electrostatic breakdown, if necessary. And, the wiring board 1c on which the CPU 1b including a nonvolatile semiconductor memory is mounted has its one side sealed or molded with, for example, a transfer mold layer 1e to form the thin plate type IC module 1 which is packaged to have a total thickness of about 0.6 mm. For making this structure, flip chip bonding, which directly applies the reverse side of the CPU 1b to the surface of the wiring board 1c, may be used instead of the wire bonding 1d. In this case, the packaged thin plate type IC module 1 may have a structure that its one side having the IC chip 1b is not entirely sealed or molded with a resin but partly coated or sealed to fill a space between the IC chip 1b and the wiring board 1c as shown in FIG. 6.

The through-hole wiring board 1c whose one side is sealed, or the back side (non-resin sealed or molded side) of the plate type IC module 1 has the flat (flat type) terminals 1a, which are led through the through holes, arranged to form a package. And, the flat terminals 1a have their surface plated with gold (Au) and, when they are used in a contact type, they function as externally connecting terminals to electrically connect with the contacts of external equipment (read/writer).

On the other hand, the card-like support 2 has dimensions (85.6 mm long, 54.0 mm wide, and 0.76 mm thick) according to the standard of, for example, JEIDA, and is provided with a fitting section for fitting or mounting at least the plate type IC module 1 with the surface of the externally connecting terminals 1a of the plate type IC module 1 exposed to be flush with the surface of the card-like support 2. Further, the card-like support 2 has the antenna 2a for sending and receiving a signal without contacting, the oscillator 2c for specifying a frequency and the power supply battery 2b built in, embedded, fitted or mounted, and also has a wiring circuit, which electrically connects the aforementioned fitted or mounted respective parts to cause the required functions of the card to operate, built in or embedded. And, the wiring circuit is internally arranged in the card-like support 2 in the form of a single layer or multiple layers, and the antenna 2a for sending and receiving a signal without contacting is generally arranged internally in the circumferential area within the card-like support 2. In this structure, when the plate type IC module 1 is fitted or mounted in the fitting section of the card-like support 2, the externally connecting terminals of the plate type IC module 1 are electrically connected to the connection terminals of the internally arranged wiring circuit. As in the first embodiment, the internal wiring circuit of the card-like support 2 of the second embodiment is a conventional single or multiple layer circuit well known in the art. The means for connecting the IC module 1 to the internal wiring circuit is also any conventional means well known in the art, for example, male and female connectors. FIG. 8 shows the connection between IC module 1, power supply 2b, and oscillator 2c via internal wiring 4.

In this embodiment, the power supply battery 2b which is built in, embedded, fitted or mounted to the card-like support 2 may be a secondary battery which can be externally charged through the externally connecting terminals 1a of the plate type IC module 1.

Examples of producing or fabricating the above thin film IC card will be described.

First, the card-like wiring board having the required circuit wiring and the antenna for sending and receiving a signal without contacting therein is formed. This card-like wiring board is produced by a conventional technology for producing printed wiring boards, such as photo-etching, lithography, and laminating technologies. Then, the card-like support 2 is produced by disposing a structure to fit or build-in the plate type IC module 1, the oscillator 2c for specifying a frequency and the power supply battery 2b in prescribed areas of the formed card-like wiring board. In this case, the oscillator for specifying a frequency and the power supply battery 2b may be previously embedded in the previous process of forming the card-like wiring board.

Then, the plate type IC module 1 is fitted and arranged in the fitting section for the plate type IC module, which is formed in a prescribed area of the card-like support 2, with the surface of the externally connecting terminals 1a of the plate type IC module exposed to be substantially flush with the surface of the card. Thus, the plate type IC module 1 is electrically connected to the connecting terminals which are previously arranged in the fitting section for the plate type IC module, and connected to the circuit wiring of the card-like support 2. Then, the oscillator 2c and the power supply battery 2b are built in or arranged in prescribed ares in the card-like support 2 and electrically connected to the prescribed circuit wiring, thereby completing the assembling and the production of a desired thin film IC card.

As obvious from the above description, this thin IC card has both functions of the contact and non-contact cards. And, in the structure of the thin film IC card according to this invention, the semiconductor device section having memory and CPU functions, mainly contributing (relating) to the functions of the card, is formed into a flat module piece, and this flat module piece can be easily attached to or removed from the card-like support. More specifically, this thin film IC card having multiple functions can be used for example as a bank card, a wireless card which saves a certain amount of money withdrawn form the bank and pays various charges like a prepaid card, or used as a commuter pass and an ID card by devising software.

What is claimed is:

1. A thin IC card comprising:
   a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and
   a card-like support having a first area and a second area formed outside of the first area, a fitting section formed inside the first area and an antenna formed inside the second area, the fitting section freely fitting the IC module detachably, and the fitting section having a connection terminal electrically connected to the connecting portion of the fitted IC module.

2. A thin IC card according to claim 1 wherein said semiconductor chip has a function to oscillate a required frequency.

3. A thin IC card according to claim 1 or 2 wherein the card-like support is a resin based wiring board.

4. A thin IC card according to claim 1 or 2 wherein said card has a thickness of 0.76 mm.

5. A thin IC card as set forth in claim 1, wherein the plate type IC module further has an input/output terminal on the surface of the IC module, and the input/output terminal is exposed to be substantially flush with the surface of the card.

6. A thin IC card comprising:
   a plate type IC module having a semiconductor chip sealed or molded with a resin on a lower portion on the IC module, the IC module having a connecting portion on the lower portion of the IC module and said module having means for direct communication with an external terminal, and the semiconductor chip having a memory and a CPU;
   a card-like support having a first area and a second area formed outside of the first area, a fitting section formed inside the first area and an antenna formed inside the second area, the antenna sending and receiving a signal without contacting, the fitting section freely fitting the IC module detachably, and the fitting section having a connection terminal electrically connected to the connecting portion of the fitted IC module; and
   a means which applies to said antenna an electric wave having a different wavelength at timing different from the signal to generate electric power for operating by electromagnetic induction.

7. A thin IC card according to claim 6 wherein said semiconductor chip has a function to oscillate a required frequency.

8. A thin IC card according to claim 6 or 7 wheein the card-like support is a resin based wiring board.

9. A thin IC card according to claim 6 or 7 wherein said card has a thickness of 0.76 mm.

10. A thin IC card as set forth in claim 6, wherein the plate type IC module further has an input/output terminal on the surface of the IC module, and the input/output terminal is exposed to be substantially flush with the surface of the card.

11. A thin IC card comprising:
    a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and
    a card-like support having a first area and a second area formed outside of the first area, a power supply battery and a fitting section formed inside the first area and an antenna formed inside he second area, the fitting section freely fitting the IC module detachably, and the fitting section having a connection terminal electrically connected to the connecting portion of the fitted IC module.

12. A thin IC card according to claim 11 wherein said semiconductor chip has a function to oscillate a required frequency.

13. A thin IC card according to claim 11 or 12 wherein the card-like support is a resin based wiring board.

14. A thin IC card according to claim 11 or 12, wherein said card has a thickness of 0.76 mm.

15. A thin IC card according to claim 12 wherein the card-like support is a resin based wiring board and said card has a thickness of 0.76 mm.

16. A thin IC card according to claim 11 wherein the card-like support is a resin based wiring board and said card has a thickness of 0.76 mm.

17. A thin IC card as set forth in claim 11, wherein the plate type IC module further has an input/output terminal on the surface of the IC module, and the input/output terminal is exposed to be substantially flush with the surface of the card.

18. A thin IC card comprising:

a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and a card-like support having a first area and a second area formed outside of the first area, a power supply battery, an oscillator and a fitting section formed inside the first area and antenna formed inside the second area, the fitting section freely fitting the IC module detachably, the fitting section having a connection terminal electrically connected to the connecting portion of the fitted IC module, and the oscillator specifying a frequency.

19. A thin IC card according to claim 18 wherein the card-like support is a resin based wiring board.

20. A thin IC card as set forth in claim 18, wherein the plate type IC module further has an input/output terminal on the surface of the IC module, and the input/output terminal is exposed to be substantially flush with the surface of the card.

21. A thin IC card comprising:

a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and a card-like support having a first area and a second area formed outside the first area, a rechargeable secondary battery, an oscillator and a fitting section formed inside the first area and an antenna formed inside the second area, the fitting section freely fitting the IC module detachably, the fitting section having a connection terminal electrically connected to the connecting portion of the fitted IC module, and the oscillator specifying a frequency.

22. A thin IC card as set forth in claim 21, wherein the plate type IC module further has an input/output terminal on the surface of the IC module, and the input/output terminal is exposed to be substantially flush with the surface of the card.

23. A thin IC card having a laminated structure comprising:

a first insulating thin plate having a window to expose and free detachably fit the side of flat type externally connecting terminals of a plate type IC module and a recessed fitting section for a power supply battery, a circuit board body having open fitting sections for said IC module and said power supply battery, being applied to said first insulating thin plate, and including a built-in antenna electrically connected to a circuit wiring, and a second insulating thin plate which is applied to the other side of said circuit board body.

24. A thin IC card according to claim 23 wherein said first insulating thin plate, said circuit board and said second insulating thin plate have a thickness of about 0.3 mm, about 0.3 mm and about 0.16 mm, respectively.

25. A method for producing a thin IC card comprising:

a step of forming a card-like wiring board including a required circuit wiring and an antenna for sending and receiving a signal without contacting, a step of forming a card-like support by providing a structure to fit or include a plate type IC module, which has on its one side a semiconductor chip having at least memory function and CPU function sealed or molded with a resin, and has flat type externally connecting terminals electrically connected to the input/output terminals of the semiconductor chip and led and exposed to a non-resin sealed or molded side, into a predetermined area of the card-like wiring board, and a step of fitting or arranging the plate type IC module in a predetermined area of the card-like support with the side of externally connecting terminals of the plate type IC module exposed to be substantially flush with the surface of the card-like support, and electrically connecting the plate type IC module to the prescribed circuit wiring in said card-like support.

26. A method for producing a thin IC card comprising:

a step of forming a card-like wiring board including a required circuit wiring and an antenna for sending and receiving a signal without contacting, a step of forming a card-like support by providing a structure to fit or include a plate type IC module, which has on its one side a semiconductor chip having at least memory function and CPU function sealed or molded with a resin, and has flat type externally connecting terminals electrically connected to the input/output terminals of the semiconductor chip and led and exposed to a non-resin sealed or molded side, an oscillator for specifying a frequency and a power supply battery, into predetermined areas of the card-like wiring board, a step of fitting or arranging the plate type IC module in a predetermined area of the card-like support with the surface of the externally connecting terminals of the plate type IC module exposed to be substantially flush with the surface of the card-like support, and a step of including and arranging said plate type IC module, said oscillator and said power supply battery in the predetermined areas of said card-like support, and electrically connecting by the predetermined circuit wiring within said card-like support.

27. A thin IC card comprising:

a plate type IC module having a semiconductor chip sealed molded with a resin on a lower portion of the IC module, the IC module having a connecting portion on the lower portion of the IC module, and the semiconductor chip having memory and a CPU, wherein the plate type IC module further has an input/output terminal on the surface of the IC module, and the input/output terminal is exposed to be substantially flush with the surface of the card; and a card-like support having an antenna and a fitting section, the fitting section freely fitting the IC module detachably, and the fitting section having a connection terminal electrically connected to the connecting portion of the fitted IC module.

28. A thin IC card comprising:

a plate type IC module having a semiconductor chip sealed or molded with a resin on a lower portion of the IC module, the IC module having a connecting portion on the lower portion of the IC module, and the semiconductor chip having a memory and CPU, wherein the plate type IC module further has an input/output terminal on the surface of the IC module, and the input/output terminal is exposed to be substantially flush with the surface of the card;

a card-like support having an antenna and a fitting section, the antenna and receiving a signal without contacting, the fitting section freely fitting the IC module detachably, and the fitting section having a connection terminal electrically connected to the connecting portion of the fitted IC module; and a means which applies to said antenna an electric wave having a different wavelength at timing different from the signal to generate electric power for operating by electromagnetic induction.

29. A thin IC card comprising:

a plate type IC module having a semiconductor chip sealed or molded with a resin on a lower portion of the IC module the IC module also having a connecting portion on the lower portion of the IC module, and the semiconductor chip having a memory and a CPU, wherein the plate type IC module further has an input/output terminal on the surface of the IC module, and the input/output terminal is exposed to be substantially flush with the surface of the card; an a card-like support having an antenna, a power supply battery and a fitting section, the fitting section freely fitting the IC module detachably, and the fitting section having a connection terminal electrically connected to the connecting portion of the fitted IC module.

30. A thin IC card comprising:

a plate type IC module having a semiconductor chip sealed or molded with a resin on a lower portion of the IC module, the IC module having a connecting portion on the lower portion Of the IC module,and the semiconductor chip having a memory and a CPU, wherein the plate type IC module further has an input/output terminal on the surface of the IC module, and the input/output terminal is exposed to be substantially flush with the surface of the card; and a card-like support having an antenna, a power supply battery, an oscillator and a fitting section, the fitting section freely fitting the IC module detachably, the fitting section having a connection terminal electrically connected to the connecting portion of the fitted IC module, and the oscillator specifying a frequency.

31. A thin IC card comprising:

a plate type IC module having a semiconductor chip sealed or molded with a resin on a lower portion of the IC module, the IC module having a connecting portion on the lower portion of the IC module, and the semiconductor chip having a memory and a CPU, wherein the plate type IC module further has an input/output terminal on the surface of the IC module, and the input/output terminal is exposed to be substantially flush with the surface of the card; and a card-like support having an antenna, a rechargeable secondary battery, an oscillator and a fitting section, the fitting section freely fitting the IC module detachably, the fitting section having a connection terminal electrically connected to the connecting portion of the fitted IC module, and the oscillator specifying a frequency.

32. A thin IC card comprising:

a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and a card-like support having a first area and a second area formed outside of the first area, a fitting section formed inside the first area and an antenna formed inside the second area, the fitting section having a connection terminal electrically connected to the connecting portion of the fitted IC module.

33. A thin IC card according to claim 32, wherein said semiconductor chip has a function to oscillate a required frequency.

34. A thin IC card according to claim 33, wherein the card-like support is a resin based wiring board.

35. A thin IC card according to claim 33, wherein said card has a thickness of 0.76 mm.

36. A thin IC card according to claim 32, wherein the card-like support is a resin based wiring board.

37. A thin IC card according to claim 32, wherein said card has a thickness of 0.76 mm.

38. A thin IC card comprising:

a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU;

a card-like support having a first area and a second area formed outside of the first area, a fitting section formed inside of the first area and an antenna formed inside of the second area, the antenna sending and receiving a signal without contacting, the fitting section fitting the IC module, and the fitting section having a connection terminal electrically connected to the connecting portion of the fitted IC module; and a means which applies to said antenna an electric wave having a different wavelength at timing different from the signal to generate electric power for operating by electromagnetic induction.

39. A thin IC card according to claim 38, wherein said semiconductor chip has a function to oscillate a required frequency.

40. A thin IC card according to claim 39, wherein the card-like support is a resin based wiring board.

41. A thin IC card according to claim 39, wherein said card has a thickness of 0.76 mm.

42. A thin IC card according to claim 38, wherein the card-like support is a resin based wiring board.

43. A thin IC card according to claim 38, wherein said card has a thickness of 0.76 mm.

44. A thin IC card comprising:

a plate type module having a semiconductor chip sealed or molded with a resin on a lower portion of the IC module, the IC module also having a connecting portion on the lower portion of the IC module and said module having means for direct communication with an external terminal, and the semiconductor chip having a memory and a CPU; and a card-like support having a first area and a second area formed outside of the first area, a power supply battery and a fitting section formed inside the first area and an antenna formed inside the second area, the fitting section fitting the IC module, and the fitting section having a connection terminal electrically connected to the connecting portion of the fitted IC module.

45. A thin IC card according to claim 44, wherein said semiconductor chip has a function to oscillate a required frequency.

46. A thin IC card according to claim 45, wherein the card-like support is a resin based wiring board.

47. A thin IC card according to claim 45, wherein said card has a thickness of 0.76 mm.

48. A thin IC card according to claim 44, wherein the card-like support is a resin based wiring board.

49. A thin IC card according to claim 44, wherein said card has a thickness of 0.76 mm.

50. A thin IC card comprising:

- a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and

- a card-like support having a first area and a second area formed outside of the first area, a power supply battery, an oscillator and a fitting section formed inside the first area and an antenna formed inside the second area, the fitting section fitting the IC module, the fitting section having a connection terminal electrically connected to the connecting portion of the fitted IC module, and the oscillator specifying a frequency.

51. A thin IC card according to claim 50, wherein the card-like support is a resin based wiring board.

52. A thin IC card comprising:

- a plate type IC module having a semiconductor chip sealed or molded with a resin on a lower portion of the IC module, the IC module having a connecting portion on the lower portion of the IC module and said module having means for direct communication with an external terminal, and the semiconductor chip having a memory and a CPU; and

- a card-like support having a first area and a second area formed outside of the first area, a rechargeable secondary battery, an oscillator and a fitting section formed inside the first area and an antenna formed inside the second area, the fitting section fitting the IC module, the fitting section having a connection terminal electrically connected to the connecting portion of the fitted IC module, and the oscillator specifying a frequency.

53. A thin IC card according to claim 52, wherein the card-like support is a resin based wiring board and said card has a thickness of 0.76 mm.

\* \* \* \* \*

UNITED STATES PATENT AND TRADEMARK OFFICE
CERTIFICATE OF CORRECTION

PATENT NO. : 5,612,532
DATED : March 18, 1997
INVENTOR(S) : Hiroshi IWASAKI

It is certified that error appears in the above-indentified patent and that said Letters Patent is hereby corrected as shown below:

Claim 8, column 8, line 30, "wheein" should read --wherein--.

Claim 11, column 8, line 50, "he" should read --the--.

Claim 18, column 9, line 17, before "antenna", insert --an--.

Claim 21, column 9, line 37, after "outside", insert --of--.

Claim 23, column 9, line 53, "free" should read --freely--.

Claim 27, column 10, line 49, after "sealed"' insert --or--.

Claim 27, column 10, line 52, before "memory", insert --a--.

UNITED STATES PATENT AND TRADEMARK OFFICE
CERTIFICATE OF CORRECTION

PATENT NO. : 5,612,532
DATED : March 18, 1997
INVENTOR(S) : Hiroshi IWASAKI

It is certified that error appears in the above-indentified patent and that said Letters Patent is hereby corrected as shown below:

Claim 28, column 11, line 1, before "CPU", insert --a--.

Claim 28, column 11, line 7, after "antenna", insert --sending--.

Claim 29, column 11, line 19, after "IC module" first occurence), insert--,--.

Claim 29, column 11, line 25, "an" should read --and--.

Claim 30, column 11, line 35, "Of" should read --of--.

Signed and Sealed this

Second Day of September, 1997

*Attest:*

BRUCE LEHMAN

*Attesting Officer*      Commissioner of Patents and Trademarks